United States Patent
Carl et al.

(10) Patent No.: US 10,873,791 B1
(45) Date of Patent: Dec. 22, 2020

(54) COMPRESSION METHOD FOR RESOURCE CONSTRAINED LOCAL AREA NETWORKS

(71) Applicant: KCF Technologies, Inc., State College, PA (US)

(72) Inventors: Christopher Carl, State College, PA (US); Jacob Loverich, State College, PA (US)

(73) Assignee: KCF Technologies, Inc., State College, PA (US)

( * ) Notice: Subject to any disclaimer, the term of this patent is extended or adjusted under 35 U.S.C. 154(b) by 0 days.

(21) Appl. No.: 16/524,949

(22) Filed: Jul. 29, 2019

(51) Int. Cl.
  *G08C 19/04* (2006.01)
  *H04Q 9/00* (2006.01)
  *H03M 7/30* (2006.01)

(52) U.S. Cl.
  CPC ............... *H04Q 9/00* (2013.01); *H03M 7/30* (2013.01); *H04Q 2209/10* (2013.01); *H04Q 2209/40* (2013.01); *H04Q 2209/88* (2013.01)

(58) Field of Classification Search
  None
  See application file for complete search history.

(56) References Cited

U.S. PATENT DOCUMENTS

| | | | |
|---|---|---|---|
| 2018/0268080 A1* | 9/2018 | Christian | G06F 16/283 |
| 2020/0201292 A1* | 6/2020 | Cella | G05B 23/0259 |

* cited by examiner

Primary Examiner — Adolf Dsouza
(74) Attorney, Agent, or Firm — W&C IP (57) ABSTRACT

A compression method for resource constrained local area networks (LANs) of an Industrial Internet of Things (IoT) reduces the volume of raw data sent from "Things" to connection points on the LAN. Applications include industrial processes, and typically include multiple sensor nodes. Sensors on machines wirelessly send data to a base station using a wireless LAN. A computer or server in communication with the wireless LAN computes the health of a machine based on the data received. The method operates by taking advantage of unique similarities between sequential groups of certain types of data that can be sent on the LAN. Mathematical operations are performed on the baseline and subsequent data sets to determine similarities. A difference is taken between the baseline and subsequent data sets, and this difference is compressed and sent to the base station where the original data is reconstructed using the baseline data and uncompressed difference data.

10 Claims, 11 Drawing Sheets

COMPRESSION METHOD FOR RESOURCE CONSTRAINED LOCAL AREA NETWORKS

BACKGROUND OF THE INVENTION

Field of the Invention

The present invention generally relates to a compression method for wireless Local Area Networks (LAN) and, more particularly, to a compression method that is specifically designed to improve LAN performance and capability by providing reduced energy consumption, improved communication reliability, and increased data throughput.

Background Description

Conventional wired sensor infrastructure is being displaced in many applications, especially mobile fleet applications, by lower cost, easier to use, and more capable Industrial Internet of Things (IIoT) sensors. From a practical and economic standpoint these new IIoT devices must be networked to each other, the Internet, and the existing industrial infrastructure using wireless communication. Low power wireless sensors can now be deployed at orders of magnitude lower cost than traditional wired sensors. Because the wireless sensor devices are typically battery or energy harvester powered, most wireless IIoT sensors are resource constrained in terms of their energy budget and wireless bandwidth usage.

In a typical IIoT application, sensors on machines wirelessly send data to a base station or data aggregator using a low power wireless LAN. A central computer or server that is connected to the wireless base station, computes the health of the machine. Recommendations are then deduced and communicated via a User Interface (UI) to plant reliability, operators, and maintenance personnel in order to improve the industrial facility quality and yield or reduce cost. By knowing the health of the machine in real-time, repair can be scheduled at times that allow for maximizing machine productivity and minimize cost associated with catastrophic machine failure. A typical industrial manufacturing facility like a paper mill has thousands of candidate machine condition monitoring or sensor locations that reside in one or more LANs within the mill.

One of the challenges for practically implementing the IIoT is enabling a high density of devices to coexist while sending data on networks with limited bandwidth. For example, many new IIoT devices will use the 900 MHZ, 2.4 GHz, or 5 GHz wireless ISM bands (Industrial, Scientific, and Medical radio bands). The ISM bands are already congested with Bluetooth and WiFi devices. The invention addresses this problem by reducing the total volume of data sent over the LAN. Less congestion practically means that the network reliability and network throughput improve, enable more frequent and more consistent machine health assessments. Frequent health assessments is important because, for example, degradation in machine health may occur under unusual circumstances that occur over a very short duration. Severe pump cavitation damage may occur only for a few minutes when the position of a process control valve on the outlet of the pump is changed.

Another challenge, particularly for sustaining IIoT devices, is managing battery replacements. This is because the devices are often located in difficult to access locations like on ceiling mounted scrubber fans, requiring lift or other means to access. The actual cost of accessing the devices in such cases can be on an order of the cost of the device itself. Considering that many of these devices are battery powered rather than hardwired, battery replacement must be minimized.

In an ideal scenario, machine health would be assessed continuously and there would be no delay between health assessments. However, to conserve energy and bandwidth usage, snapshots of data are acquired intermittently so that the device can conserve energy in a standby state between snapshots. Within a snapshot high frequency sampling is used to characterize the machine behavior that is associated with developing faults. A snapshot is typically composed of hundreds or thousands of measurements that are evenly spaced in time, loosely known as a time series data set. For example, a rolling element bearing defect is apparent in a vibration time series when the rolling element contacts a blemish in the race on which it rides. This contact creates small impact events that occurs for durations of milliseconds. The high frequency sampling within a snapshot enables these impacts to be measured using a transducer such as an accelerometer.

In most machinery health and condition monitoring applications, and IIoT application in general, sequential time series data snapshots fundamentally differ by only a small amount. For example, a pump may run with a fixed speed and pressure for hundreds of hours rendering small difference between the time series snapshots. Measurements like vibration, pump pressure over time, and the motor current and voltage signatures show this pattern of consistency. In automotive manufacturing, robotic cycle times are typically on an order of 20-90 seconds. Each cycles is nearly identical to the one before it except when a flaw, such as slop in a bearing or belt, begins to develop. Even in such cases the flaws are evident in small differences relative to the absolute amplitude of the measurements.

SUMMARY OF THE INVENTION

The invention addresses the competing demands of performance and life cycle cost for battery or energy harvester powered sensor nodes in a local communication network such as a wireless LAN. It principally operates by taking advantage of unique similarities between sequential groups of certain types of data that are sent within a LAN, in order to reduce the total average volume of data that is sent in the LAN.

According to the invention, there is provided a compression method for wireless LANs which provides reduced energy consumption, improved communication reliability, and increased data throughput. The invention operates by taking advantage of unique similarities between sequential groups of certain types of data in order to reduce the total average volume of data that is sent in the LAN. By enabling the same information to be sent in smaller packets, the invention reduces the energy consumption of the device by reducing the time that the wireless radio is in use. Reducing the time that the radio is in use has a large impact on the overall energy budget of typical IIoT devices because the wireless components often account for the majority of the devices total energy budget. In general, there also may be a tradeoff between node capability and its weight or size, and, consequently, a tradeoff between the functionality and life cycle cost. This tradeoff may be particularly keen for wireless IIoT devices because of the limited energy budget, high data throughput and high reliability requirements.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION THE INVENTION

The invention applies to the Internet of Things (IoT) in general and, more particularly, to the Industrial Internet of Things (IIoT). By way of reducing the volume of raw data sent from "Things" to connection points to the "Internet", the invention improves practical implementation of the IIoT. Applications include monitoring or control of machines, vehicles, aircraft, civil infrastructure, manufacturing facilities, or industrial processes, a network of devices may include multiple sensor nodes.

Figure 1:
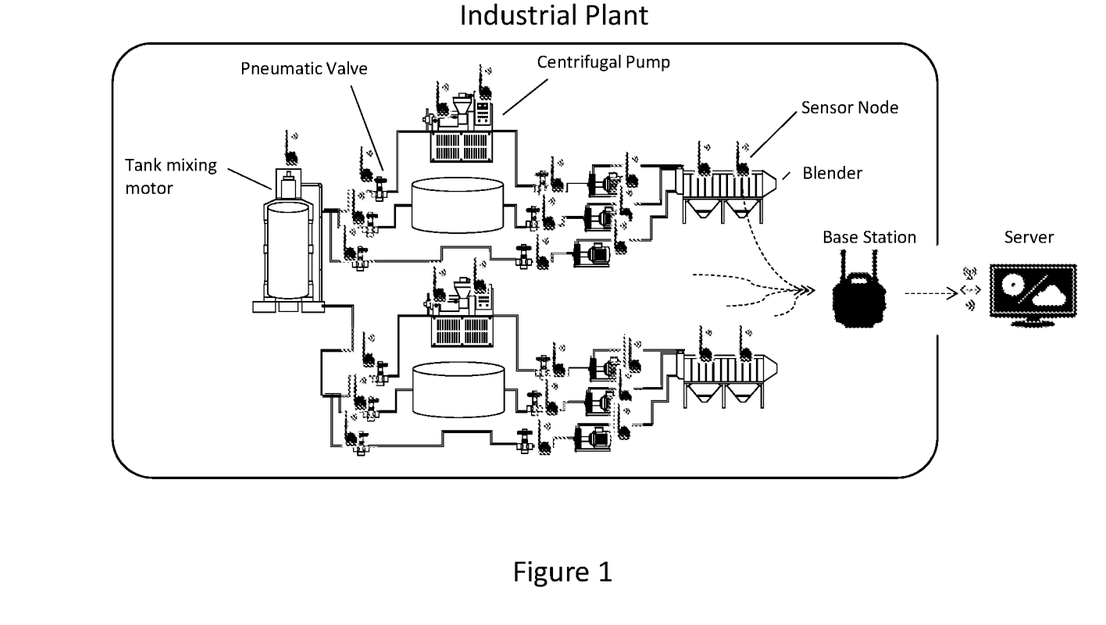
FIG. 1 is an illustration of an industrial plant where the monitoring system is employed and compression method of the invention is used.

Since the life cycle of most industrial infrastructure is on an order of 20 to 50 years, IIoT devices will need to be added, or retrofit, to existing assets. A typical plant layout and implementation of the invention is shown in FIG. 1. FIG. 1 is intended to show a generalized industrial plant of the type in which the invention may be implemented. Wireless vibration sensors $11_1$ to $11_n$, which are a central source of signals in this implementation of the invention, are a tool used to measure the health of a wide range of equipment including motors 12 driving tank mixing, pneumatic valves $13_1$ to $13_m$, blenders $14_1$ and $14_2$, and centrifuges $15_1$ and $15_2$. FIG. 1 illustrates that many of these sensors $11_1$ to $11_n$ may communicate to a central data aggregator known as the base station 16. The base station 16, in turn, communicates with a server 17, which can be located off site. Continuous online monitoring of asset vibration for determining asset health has not traditionally been included in original plant designs for low cost pumps and motors. These sensors are therefor typically retrofit to the equipment. The scale of the sensors relative to the equipment they are mounted on in FIG. 1 is not to scale in order to show the applicability and general architecture of the implementation of the sensor monitoring system.

The compression method of the invention is designed to exploit vibration signals of rotating machines like pumps shown in FIG. 1. From a practical and economic stand point these devices must be networked to each other, the internet, and the existing industrial infrastructure using wireless communication. This network will be referred to as a Local Area Network (LAN).

Figure 2:
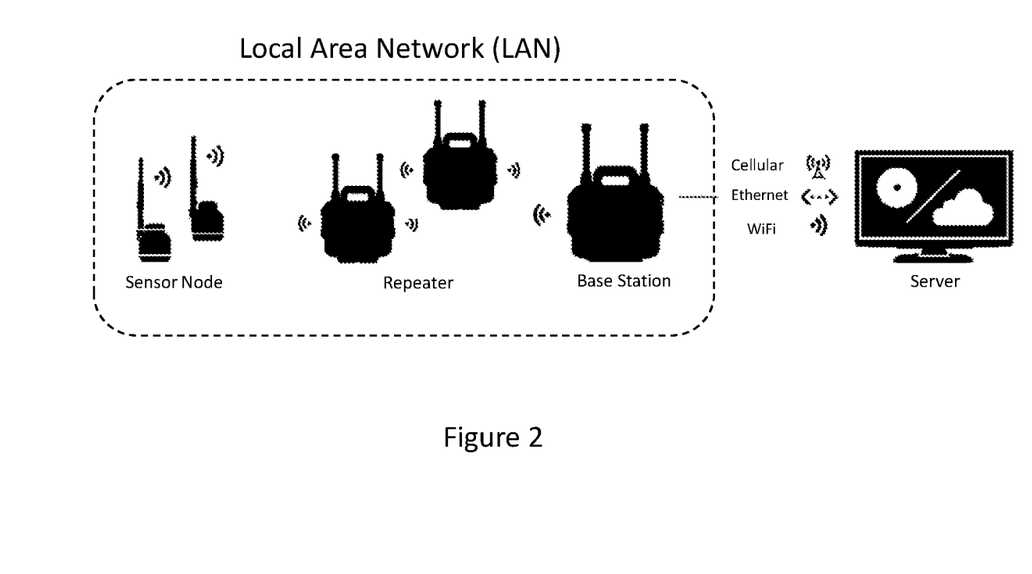
FIG. 2 is a system diagram of a typical wireless LAN in which the compression method according to the invention may be implemented.

As shown in FIG. 2, the LAN is principally composed of a plurality of sensor nodes 21 and a central base station 22 that manages the local network and interface to a more extensive or external network. Repeaters 23 can be located between the sensor nodes to extend the range of the sensors. The data is sent from the base station 22 to a server 24 that may be located at the industrial site or remotely. The remote implementation of the server can either be a corporate server that is within the corporation's firewall or it can be a cloud hosted server. An example cloud hosted server would be one provided by a service like Amazon Web Services (AWS). The base stations may communicate to the server via a wireless cellular, satellite, or WiFi connection. The base station can also use an Ethernet connection for communication to the server.

Nodes in the LAN must be battery or energy harvester powered thereby eliminating the requirement for expensive hardwiring. Within this context, most IIoT devices are resource constrained in terms of their energy budget and bandwidth usage. The invention is uniquely designed to achieve high compression levels while requiring small amounts of energy to implement.

Compression in the communication link between the nodes and repeater or base station is most important since the nodes are small and have the most limited energy resources of the components in the LAN. Therefore, compression is implemented at each of the nodes. Decompression can be implemented at any stage in the data path beyond the nodes which could include the repeater, base station, or server.

Due to the limited processing and energy resources at the sensor nodes, this invention's utility is particularly relevant for the sensor nodes in the LAN. A diagram of a sensor node with a compression module is show in FIG. 3. In this example, the sensor node 30 is assumed to be attached to a machine 31, such as a rotating machine, for the purpose of detecting vibrations that may indicate the need for service. The sensor node 30 includes a sensor transducer 301, which performs the measurement, and outputs a signal to an analog antialiasing filter 302. The output of the antialiasing filter 302 is input to an analog-to-digital converter (ADC) 303 that produces a digital representation of the analog signal. The analog antialiasing filter 302 and the ADC 303 constitute the data acquisition component of the sensor node. The digital output of the ADC 303 is input to a compression method evaluator 304, the output of which is supplied to a bit stream compressor 305 or a compressor 306 which implements the Compression Agent for Resource-constrained Local-area-networks (CARL) according to the invention. The compression method, bit stream or CARL, is set based on the type of data that is being sent. When a machine is off, the data is dominated by noise and has a low amplitude so it should be compressed with the bit stream method. CARL compression does not work well for this type of data. However, when the machine is running, CARL compression works well. A simple amplitude of the signal assessment is sufficient to know which state the machine is in. The CARL compressor 306 communicates with a baseline signal manager 307. The components 304 to 307 are implemented in the firmware of a microprocessor.

Figure 3:
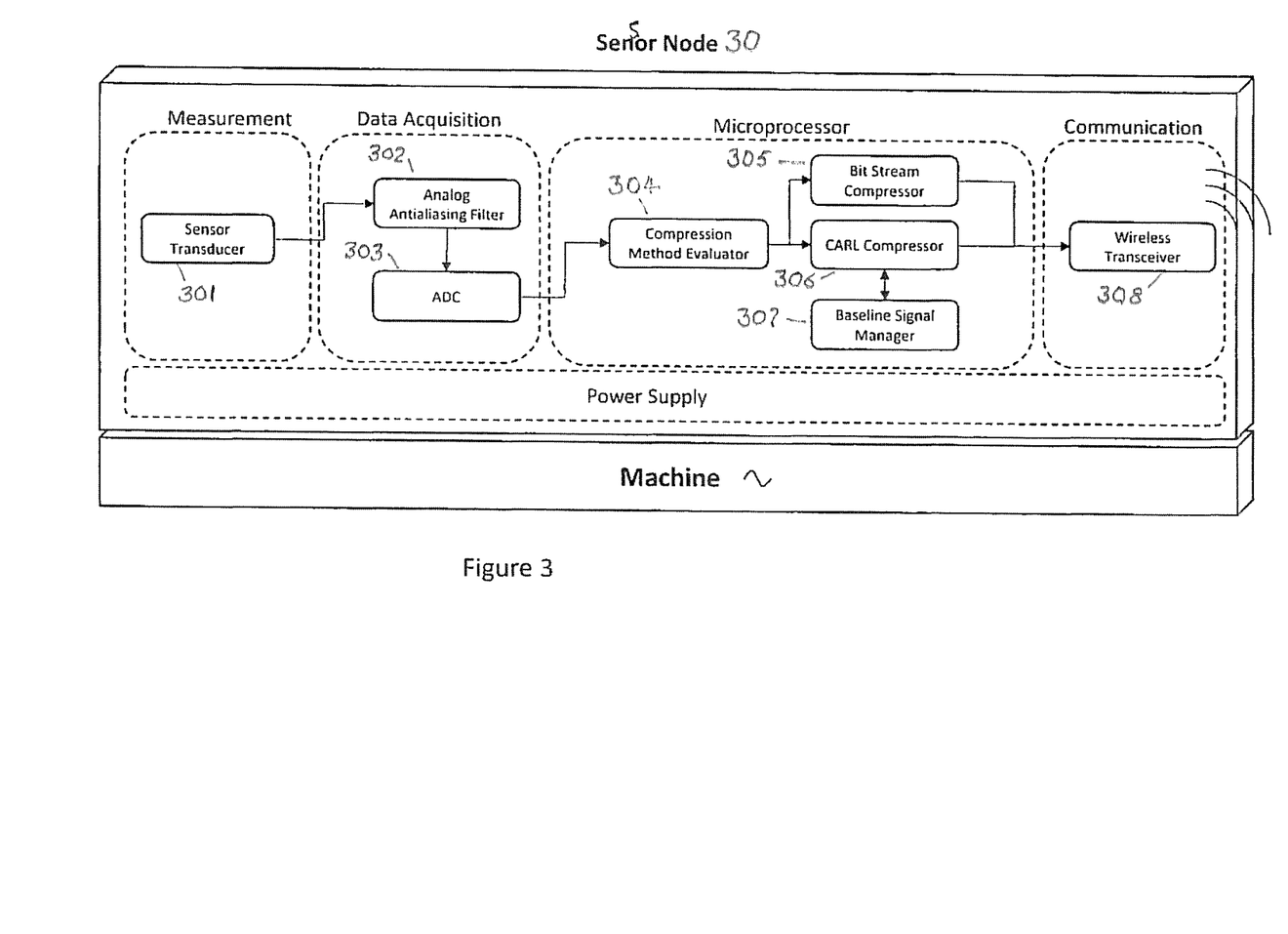
FIG. 3 is a block diagram of a node device in which the compression method is embedded.

The compression method according to the invention is implemented in the microprocessor in the node. The basic firmware modules for implementing the compression are the compression method evaluator 304, the bit stream compressor 305, the CARL compressor 306, and the baseline signal manager 307. The output of the microprocessor is input to a wireless transceiver 308, which constitutes the communication component of the sensor node. All communications from the sensors to the receivers, e.g., base stations, is acknowledged via the receivers sensing a small data packet back to the sensors. The returned packet allows the sensors to know that what they sent was received. It also provides a means for the sensor nodes to receive commands from the receiver. This is needed because the nodes generally reside, except when measuring the equipment and sending data, in a dormant state to save energy.

Figure 4A:
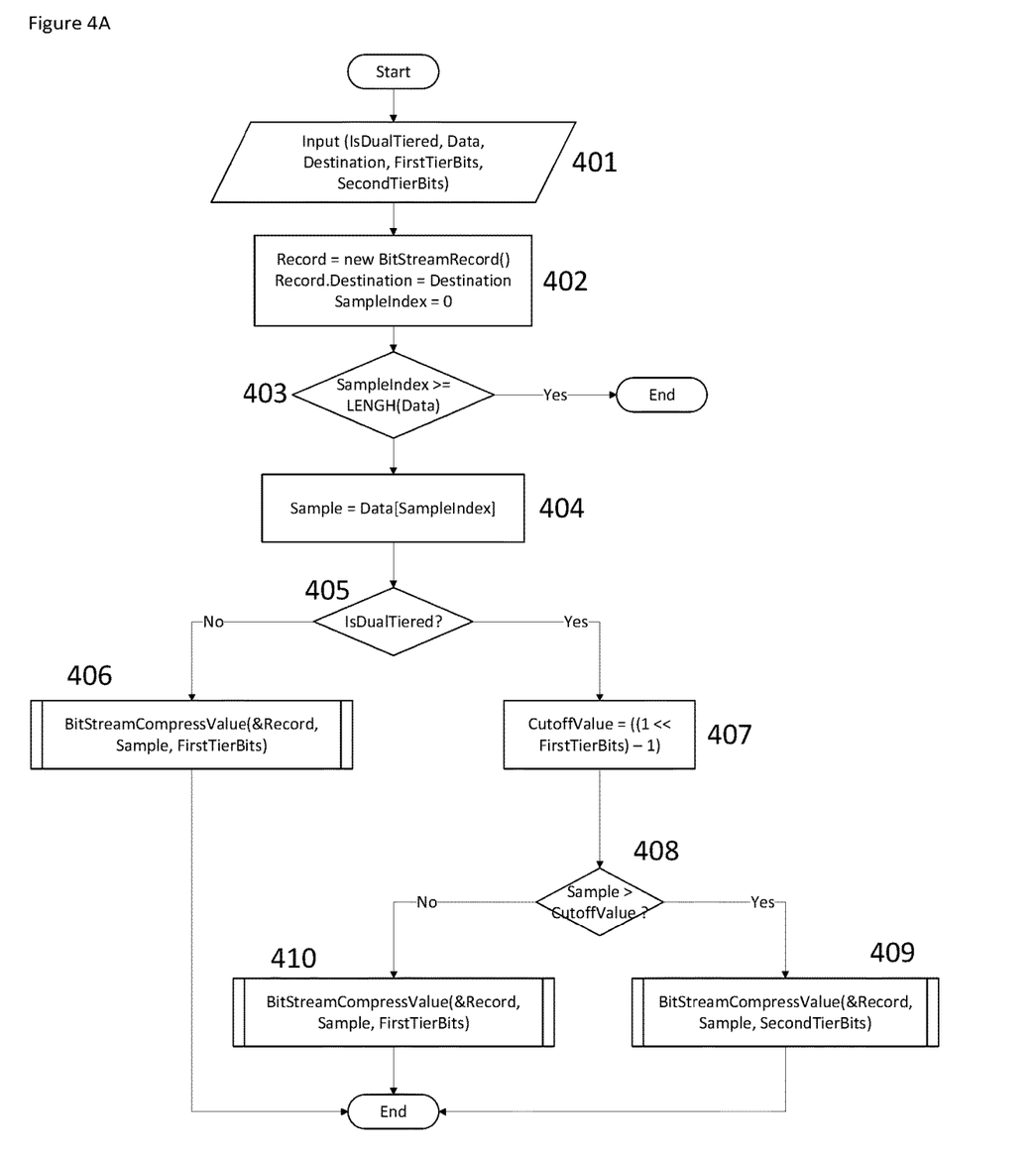
FIGS. 4A to 4D are flow diagrams illustrating the processes performed by the node.

The overall compression scheme is shown in FIG. 4A. The first step in the data compression involves determining what compression technique best suites the node measurement data at a given point in time. This first step is implemented as the compression method evaluator block in FIG. 3. While that step can involve many considerations, the primary embodiment of the invention uses a simple threshold criterion for determining the compression method.

This is because industrial machines typically have two states of operation, running and stopped. As described above, the type of data associated with the two states is very different and therefore different compression techniques apply. The two compression methods are bit stream and CMRL compressed.

When a machine is stopped, the data measured characterizable as low-level noise associated with the sensor itself or from vibration induced in the target machine from other machines in the plant. The node does not know the state of the machine except through interpretation of the data that it measures. One approach to decide which compression approach involves the node comparing the data amplitude to a fixed known threshold that is a value between the typical running amplitude and stopped amplitude. The data amplitude can be taken as the maximum sample in a data block or sample set rather than each individual measurement. Generally, all operations in this compression method apply to blocks or snapshots of multiple data points rather than individual measurements for power efficiency reasons and because CARL compression operates on groups of individual measurements values that are treated as blocks.

Determining whether to use bit stream compression or CARL compression can also be based on a cost function. The cost function can be formulated in terms of minimizing energy consumption at the node or maximizing the data compression ratio. The computational energy cost of performing the simple compression is fixed and known. So too is the energy per bit consumed at the node to send data over the LAN. The expected compression level using the CARL and bit stream methods can be estimated based on previous data set compression iterations. Using these metrics, the cost of pursing each method can be compared. This decision can be repeated for each data set or the first data set after a baseline is established.

In the stopped condition there is virtually no similarity between data sets taken at different times and the amplitude of the data is low. Considering these two conditions a compression technique known in the prior art called "bit stream compression" is well suited. Bit stream compression works by removing all unused bits and packing data into a bit stream format. This approach is enhanced with the capabilities of performing a dual-tiered scheme if necessary. The purpose of a dual-tiered approach is to prevent a small number of large-valued data points from skewing the compression of otherwise small-valued data points. An overview of bit stream compression is shown in FIG. 4A.

The input step 401 takes in the data to be compressed, along with the number of bits that each tier should be compressed by. At function block 402, a new record is created that maintains the book-keeping information for the compression method. A check is made at decision block 403 to determine if samples have been compressed and, if so, the process ends, otherwise the next sample to be compressed in function block 404. A determination is made in decision block 405 as to whether to use the single or dual-tier scheme. If the single-tier scheme is chosen, the sample is compressed using the number of bits defined for the first tier. If the dual-tier scheme is chosen, cutoff values between first and second tiers are computed in function block 407. A check is then made in decision block 408 as to whether the sample is above or below the cutoff value. If the sample is greater than the cutoff value, the value is compressed at function block 409 using the number of bits defined for the second tier. If the sample is less than or equal to the cutoff value, the value is compressed using the number of bits defined for the first tier.

Figure 4B:
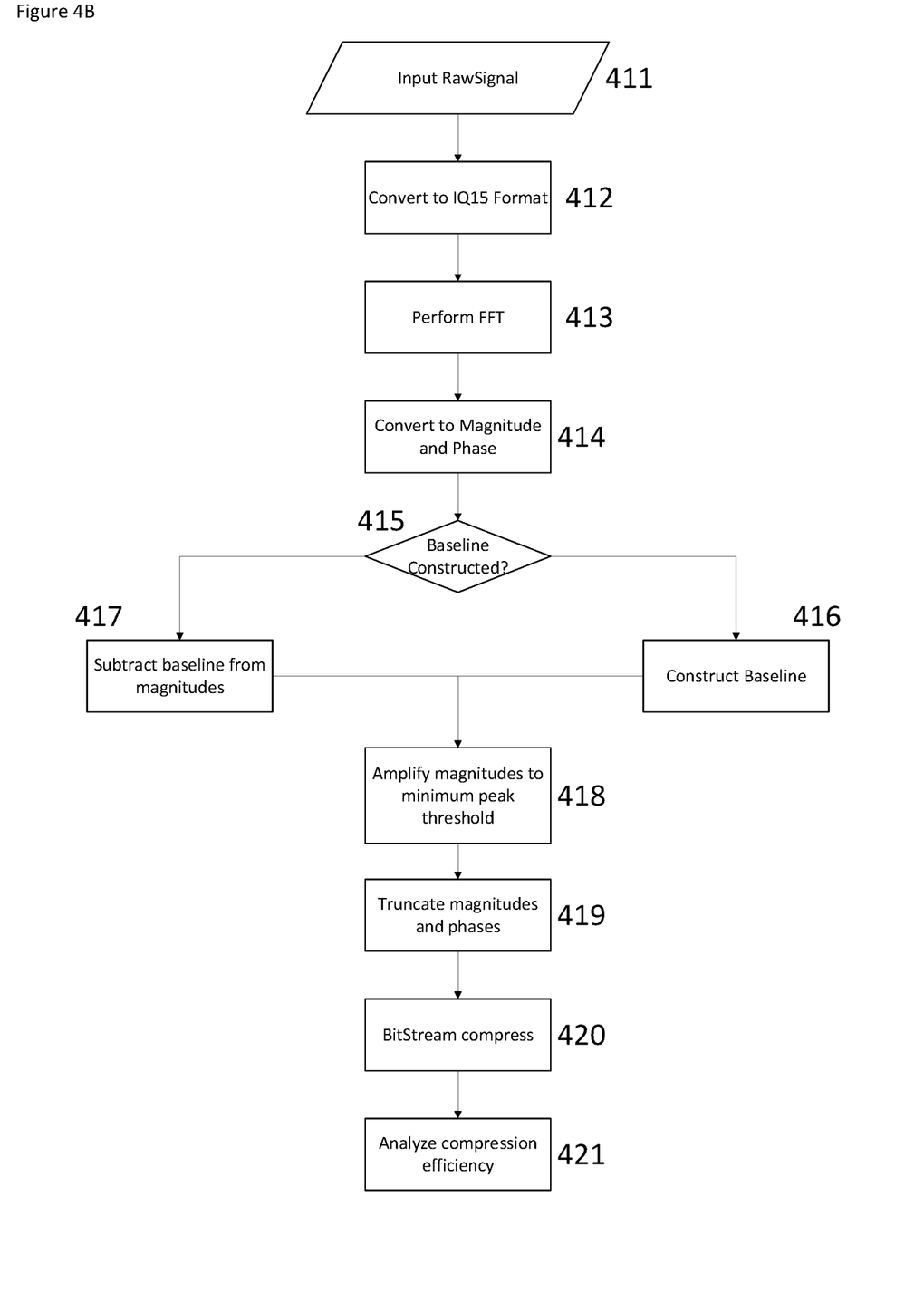

In contrast to the case when a machine is idle or stopped, when the machine is running, the amplitude of the data is high and bit stream compression is ineffective for compressing the data. In this case the CARL compression method is applied. The CARL compression method is shown in FIG. 4B.

The process begins at input step 411 by taking in the raw time-series signal. The raw signal is converted at function block 412 to IQ15 fixed-point format. Then, at function block 413 Fast Fourier Transform (FFT) is performed on the raw signal. The FFT output is converted from real/imaginary values to magnitude/phase values at function block 414. Using an amplitude and phase representation of the frequency domain data rather than real and imaginary is important because the precision of the phase data set can be reduced with little impact on the reconstructed vibration signature. A check is made at decision block 415 to see if there is a valid baseline that has been constructed. If there is not already a valid baseline, the magnitudes are used in function block 416 to aid in the construction of the baseline; otherwise, the magnitudes are modified in function block 417 by subtracting the baseline. Then, in function block 418, the resulting magnitudes are amplified so that a minimum peak threshold is satisfied. This minimum peak threshold ensures that the desired maximum error is not exceeded. The phases and amplified resulting magnitudes are truncated in function block 419 by removing the fractional bits and ensuring integer representation of each value. The compression level, e.g., truncation and precision reduction, can be tuned to hit a specific error level. Bit stream compression on both the magnitudes and phases is performed in function block 420. The efficiency of the compression is analyzed in function block 421 to aid in the decision as to whether the system needs to be re-baselined.

This CARL compression method is predicated on the idea that small numbers can be represented by fewer bits than the raw larger numbers, resulting in smaller amounts of data that are sent over the LAN. For example, machine health data may be represented by 16 bits per measurement point. When the amplitude of the measurements is high, all 16 bits are essential for representing the amplitude with a given precision level. If the health data amplitude can be reduced in amplitude while still preserving the same precision, the number of bits representing each point can be reduced. For example, if the full amplitude range of an acceleration sensor is ±10 G with precision of 0.3 mG, then 16 bits are required to represent the signal. By using the CARL method, a ±10 G signal can be represented by a 0.01 G, then the signal can be represented by 8 bits per point rather than 16 bits. This would result in a compression ratio of two times.

To reduce the number of bits per data point, the CARL compression method takes advantage of similarities in sequential snapshots of data acquired and sent within the LAN. The CARL method relies on a baseline measurement from which sequential data sets reference and use to reduce the size of the data set. The baseline is subtracted from subsequent data sets. This is facilitated by acquiring a representative data set for a given machine state of operation and sharing it with both the compressor and the decompressor.

The most straightforward differencing implementation would be to perform the baseline subtraction operation using the raw time signals as is described in prior art, meaning that the time series data set collected by the sensor is directly used in the differencing. However, this approach has little value for complex signals like machine vibration. This invention takes a different approach by using data manipulation techniques like Fourier transforms to expose similarities that are expressed in the frequency domain and otherwise hidden in the time domain.

For example, a gearbox time series may appear to look like white noise having very little similarity from snapshot to snapshot. However, using a transformation of the time waveform into the frequency domain, each gear mesh produces a set of clear peaks in the amplitude frequency spectrum, and rendering consistency between snapshots. This is essential for practical reasons, including the problem that the start of data snapshots are not asynchronous with the machine operation or rotation.

The frequency domain amplitude of each sequential snapshot is often similar and therefore the difference will be small, enabling an opportunity for high levels of compression. The differenced data sets can then be compressed by eliminating the most significant bits that are not used for small amplitude values. The bit stream compression technique can be used for this step. In addition, certain differences may be small enough that they can be eliminated altogether. An amplitude threshold can be set for determining which difference frequency components are eliminated. The threshold may vary over the frequency range. For example, low frequencies usually contain high amplitude motion that represents the fundamental machine vibration. The threshold can be relatively high for these amplitudes without compromising the health assessment of the machine. However, higher frequencies where bearing information resides often has a much smaller amplitude and a smaller threshold is needed. The threshold can also be based on the maximum amplitude of the signal. For example, a 1% elimination threshold relative to the maximum amplitude can be specified. With this approach, any difference frequency components that are less than 1% of the maximum frequency component can be set to a zero value and not sent.

There are several steps shown in FIG. 4B for implementing the CARL compression method in an energy constrained wireless node. Namely, the signal is converted from floating point numbers to fixed point numbers thereby facilitating computationally efficient data processing. The format for the converted data is IQ15. Performing integer calculations in a microcontroller is significantly faster than floating-point calculations. Fixed-point numbers are integer representations of floating-point numbers. To speed up the computational processing time, the Qn/IQn fixed-point representation is used, where n refers to the number of fractional bits. The following equation shows the conversion between Qn/IQn and decimal/floating point.

$$Qn(x_q) = x_i \times 2^{-n}$$

The Qn format is stored as a 16-bit signed integer. The IQn format is stored as a 32-bit signed integer. As an example, a number stored in the Q15 format has 15 fractional bits and 1 integer bit. Conversely, the IQ15 format has 15 fractional bits and 17 integer bits.

Another key step shown in FIG. 4B is scaling (generally amplification) of the signal being compressed relative to the baseline so that the peak value in the frequency spectrum falls within a designated maximum error threshold. This threshold parameter specifies that the largest amplitude value in the frequency domain will have an error that falls within a fixed user defined maximum error threshold. This step is important because it controls the error rather than holding the compression level fixed. The implication is that a maximum error limit is enforced but the compression level may vary over time. This step is shown as "amplify magnitudes to minimum peak amplitudes" at function block 418 shown in FIG. 4B.

The frequency domain representation of a signal consists of two data sets, amplitude and phase, each having half as many individual data points as the time series data set. Analysis of machine vibration involves using the amplitude values and therefore their accuracy is most important while the phase is not used directly for vibration analysis. The differencing scheme that is fundamental to the CARL compression method only applies to the amplitude portion of the frequency domain signal. The phase information is not consistent over time in the way the amplitude values are. Therefore, a different compression method is needed for the phase.

While the phase data is not important for machine analysis, it is important for reconstructing the time series in the decompression stage. The amplitude of the reconstructed time series has a low sensitivity to error in the phase as compared to the error in the frequency domain amplitude. Significant reductions in the precision of the phase introduces only a very minor error in the reconstructed signal. The phase signal is not compressed by reducing the amplitude (and most significant bits) of the phase representation, rather it is compressed by eliminating the least significant bits, thereby decreasing its precision. The amount that the precision is decreased may vary depending on the frequency. For example, the phase components in the low frequency region may be important for orbital vibration analysis where the type of shaft misalignment can be diagnosed. The reduction in the precision of these low frequency components may be less than the reduction in precision of the higher frequency components of the phase. This step is shown in FIG. 4B as "Truncate magnitudes and phases" at function block 419.

Figure 4C:
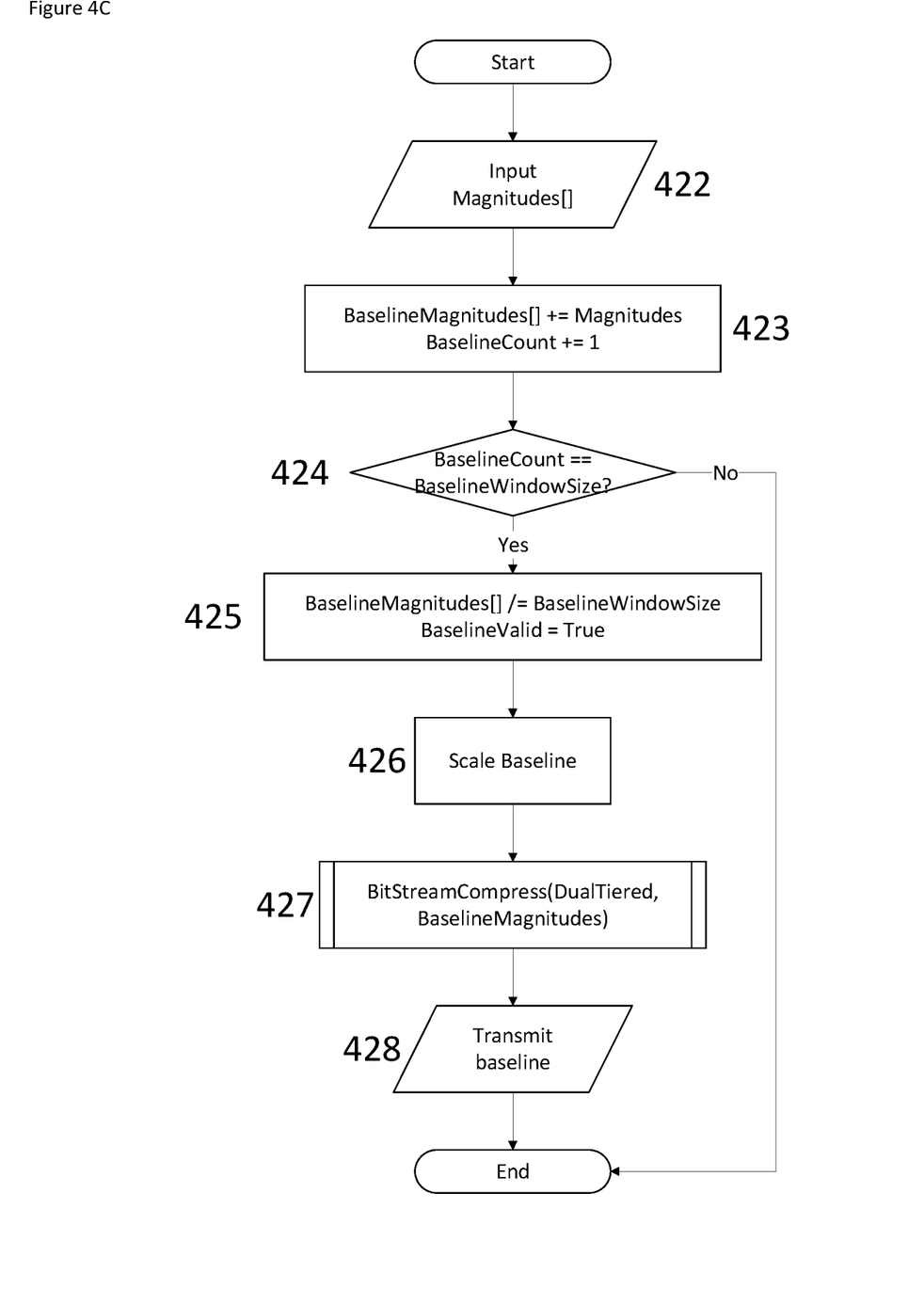
Figure 4D:
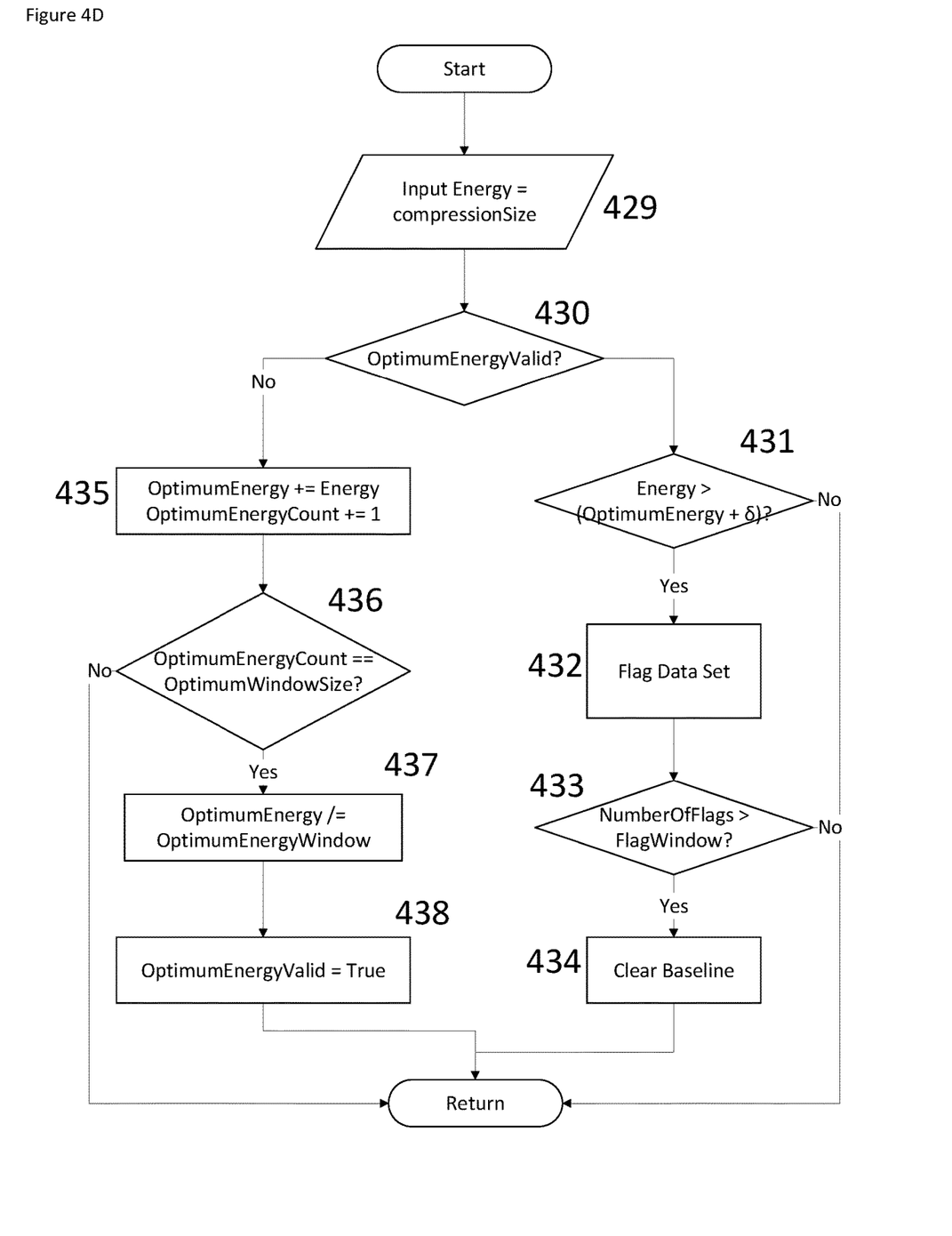

Because machine vibration changes over time, new baselines are needed from time to time in order to maintain a high compression ratio. The invention sets new baselines if the machine changes beyond a certain point. This is monitored with each data set that is generated and when the difference that is being sent is larger than a certain level (threshold), then the node acquires a new baseline and sends that to the base station to use as the new standard. This is required to maintain a high compression level. The criteria for changing the baseline can be set based on optimizing the energy consumption of the node. The process of generating and sharing the baseline with the decompressor over the wireless link is shown in FIG. 4C. One embodiment of the process for evaluating when to acquire a new baseline is shown in FIG. 4D. Generally, this process involves evaluating the energy efficiency of the compression scheme.

Referring first to FIG. 4C, construction of the baseline, the process begins at the input step 422 by taking in the un-amplified magnitudes of the signal. The magnitudes are added to the current baseline construction in function block 423. A determination is then made in decision block 424 as to whether enough sample sets have been added to the baseline. The current iteration ends here if this criterion has not been satisfied. The baseline is averaged in function block

425 by dividing by the number of sets. This also marks the flag to indicate the baseline is valid. The baseline values are scaled in function block 426 so that they do not exceed a maximum number of bits per sample. At function block 427, the baseline is compressed using a dual-tiered bit stream scheme, and the result is stored. The compressed baseline is transmitted to the host at function block 428.

Referring next of FIG. 4D, compression efficiency analysis, the process begins at input step 429 where the compression size is reinterpreted as the input energy. The input energy is then check in decision block 430 to determine if the optimum energy has been computed and is valid for comparison. If the energy is valid, a further check is made in decision block 431 to determine if the input energy exceeds a threshold above the optimum energy. If the data set exceeds the optimum energy threshold, the data set is flagged at function block 432; otherwise, a return is performed. Next, a check is made at decision block 433 to determine how many data sets have been flagged within a predetermined window size. If the number of flagged sets exceeds the threshold, the baseline is cleared in function block 434; otherwise, a return is performed. Returning the decision block 430, if the optimum energy is not valid, a check is made at decision block 436 to see how many sample sets have been added to the optimum energy sum. At function block 437, the optimum energy sum is averaged by dividing by the number of samples that are added. A flag is set at function block 438 to indicate the optimum energy has been computed and is valid.

The compression level and ultimately the energy required to perform the CARL compression method worsens as a signal's frequency spectrum deviates from the baseline. If the energy consistently surpasses a desired threshold, the operating conditions are considered sufficiently deviant and the baseline is nullified. Consequently, a new baseline is generated that better represents the measured data.

The re-baselining method compares the transmission energy $E_i$ of an input signal I with a calculated optimal transmission energy $E_{opt}$. By considering the energy $E_{base}$ required to transmit a new baseline, the following conditions must hold to invoke the nullification of the active baseline:

$$NE_i > E_{base} + NE_{opt}$$

$$E_i > \frac{1}{N}E_{base} + E_{opt}$$

where N is the threshold defining the allowable disparity.

The optimum energy $E_{opt}$ is computed by first assuming that data sets collected immediately following the baseline calculation are most efficiently compressed via that baseline. Further, this assumes the asset's operating condition has not varied since the baseline was calculated. This allows for the optimum energy to be computed by averaging the subsequent transmission energies within a specified window threshold:

$$E_{opt} = \frac{\sum_{i=0}^{w-1} E_i}{w}$$

If the conditions do not hold true, the data set is flagged as a re-baselining candidate. If the number of flagged candidates exceeds a specific threshold within a desired window range, the baseline is nullified and generation of a new baseline is pursued.

Establishing a new baseline involves acquiring and averaging multiple data set frequency domain magnitudes. Subsequent data sets are earmarked with, for example, a hash code based on which baseline was used to compress the data. The hash code is important if baselines are changed because the data set reconstruction is dependent on which baseline is used.

While the process illustrated in FIG. 4D offers one approach to managing the baseline, it can be done on a fixed schedule, using the number of packets sent as a trigger, or based on the compression level crossing or repeatedly crossing a lower threshold. For example, the baseline could be reestablished every hour, every 10 data packets, or when the compression levels falls below a factor of two where the compression level is calculated as a ratio of the original data set size to the compressed data set. The method according to the invention typically produces compression levels of two to five. With respect to the latter method for initiating re-baselining, if the compression level is inadequately low, re-baselining may be used to reduce the difference and improve the compression. However, machines often have short in duration and temporary anomalous behavior which is evident in the data sets. The compression level for these data sets will be low for a small number of data sets and then return to a high compression level as the anomalous behavior subsides. Re-baselining in this case for a few data sets is not desired because there is a bandwidth and energy penalty for re-baselining. To address this, a rolling average may be used to keep the method from re-baseline in such cases.

Another approach to re-baselining is a continuous method where the base station updates the baseline as the reconstructed data set for each data transaction that is completed. Similarly, the node always uses the last data set as the baseline for the next subsequent data set. This approach works well when the data sets evolve slowly over time. However, it will introduce error that will compound as the number of transactions increases. This is because the small error between the original data and the reconstructed data will be incorporated in the next baseline, effectively handing that error to the next data reconstruction iteration. A combination of the continuous method and the more conservative periodic baselining methods can be used. In this case, a new lossless baseline would be sent periodically and between those baselines, the baseline would evolve according to the continuous baselining method.

This invention has been reduced to practice and its performance in a typical machine application is shown in FIGS. 5A-5F. The machine is an industrial fan blower. The sensor in the node is an accelerometer that measures the vibration of the fan blower motor. The data shown in the FIGS. 5A-5F plots were taken over a period of time where the fan speed was fixed at the motor controller but all other extraneous variables like temperature and humidity were allowed to vary. During the collection period, the amplitude was sufficiently high that the CARL compression method was used in all cases.

This compression method is an ideal fit for machinery health data and more specifically machinery vibration signature. Machinery vibration signatures contain symptoms that can be used to diagnose machinery faults and predict their pending failure. A typical asset that this would be applied to is a fan blower. The fan is a centrifugal blower with a direct drive motor. The motor rotor is supported by ball bearings. Typical failure modes of this asset include bearing wear out and failure, rotor imbalance, loose mounting base, and misalignment between the motor and fan impeller.

The severity of a problem is evaluated based on the peak vibration (half of the peak-to-peak) or based on the average, calculated as the Root Mean Square (RMS) vibration, level of a time-series waveform. The waveform can either be an acceleration signal or a velocity signal. In the case of the fan blower, an acceleration signal is used as shown in the upper plot of FIG. 5A, 5C, 5E. Notice that the peak vibration is roughly 1 g and the RMS value is roughly 0.5 g. A typical threshold for categorizing this asset as healthy is an RMS vibration less than 1.5 g.

Figure 5A:
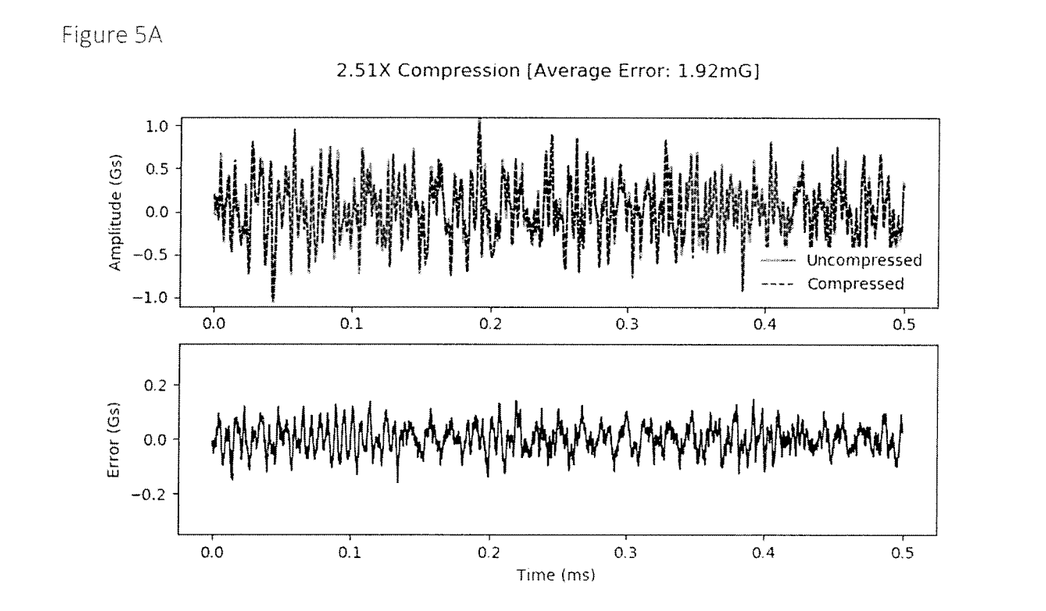
FIGS. 5A to 5F illustrate the compression method performance in time and frequency domain plots for an industrial blower machine.

Inaccurate time waveforms can lead to premature machine maintenance or risk of unexpected failure, which can lead to expensive unplanned downtime of a facility related to the blower. In FIG. 5A the compression level is 2.51× and the average error is on an order of 1.92 mg. The error for each point in the time series signal is shown in the lower plot of FIGS. 5A, 5C, 5E.

Figure 5B:
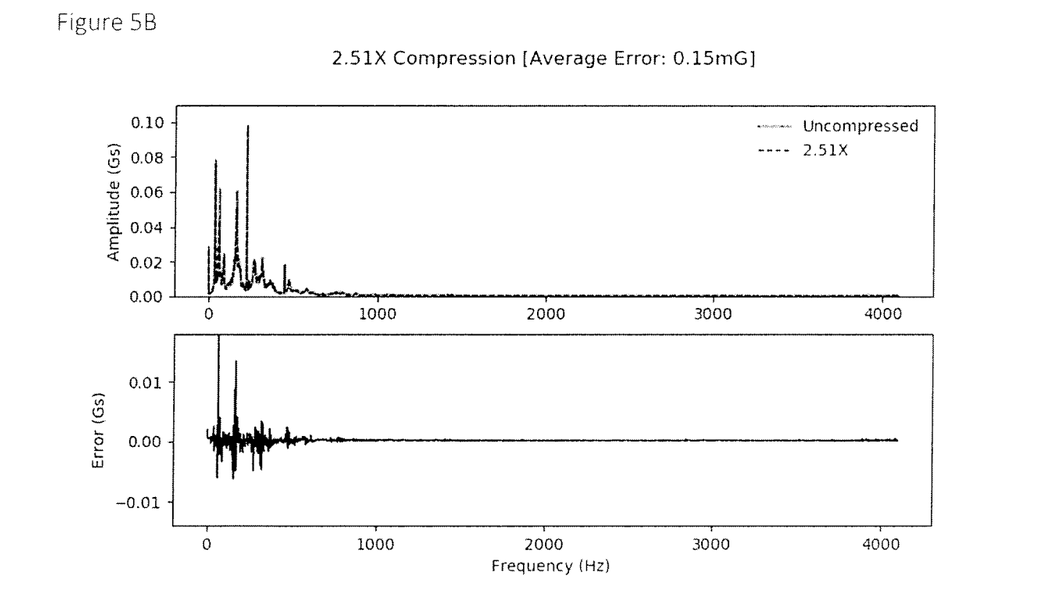
Figure 5C:
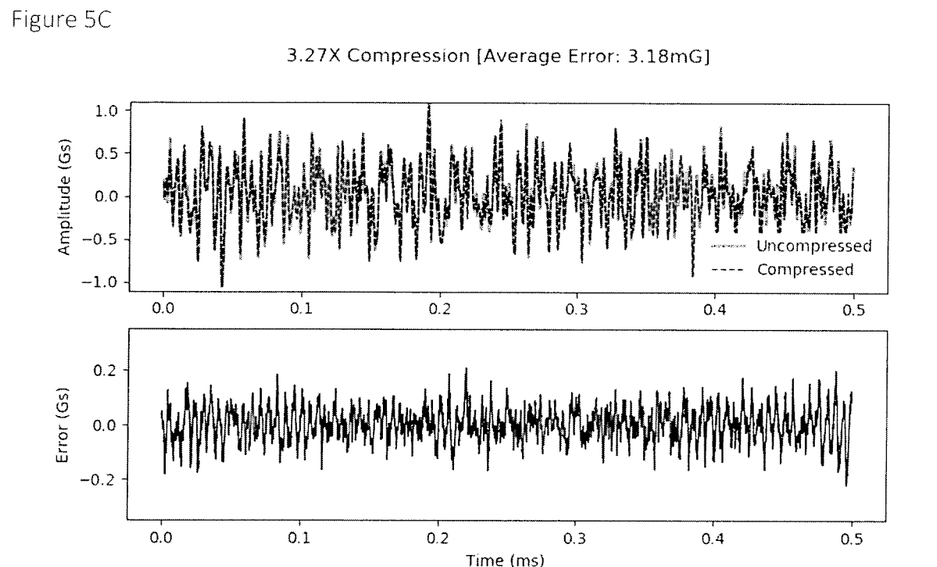

FIG. 5C shows the time series signal and error for a compression level of 3.27× rather than the 2.51× shown in FIG. 5A. Similarly, FIG. 5E shows the time series signal and error for a compression level of 4.98×. The higher compression levels are achieved by increasing the level of tolerance for a difference between the baseline and the signal being compressed. This results in removal of certain small characteristic values from the data set and in turn an increase in the error of the compressed signal.

Notice that the error increases from 1.92 mg for the 2.51× compression level to 4.22 mg for the 4.98× compression level. The tradeoff in error vs compression is apparent in this example. A appropriate level of error tolerance can be chosen for a given application an a corresponding compression level can then be selected and applied.

While the frequency domain representation of a signal is foundational to this compression technique, it is also useful for diagnosing or classifying the fault. In the case of the blower machine, rotation speed of the asset is shown at a peak in the spectrum plot and the blade pass is also shown as a separate peak that will occur at a frequency which is the number of blades (48 in this case) times the running speed of 30 Hz. If there is a broken blade, the blade pass peak will increase in amplitude while the running speed peak will remain constant. However, if the fan is imbalanced, the peak corresponding to the running speed will increase in amplitude.

Figure 5D:
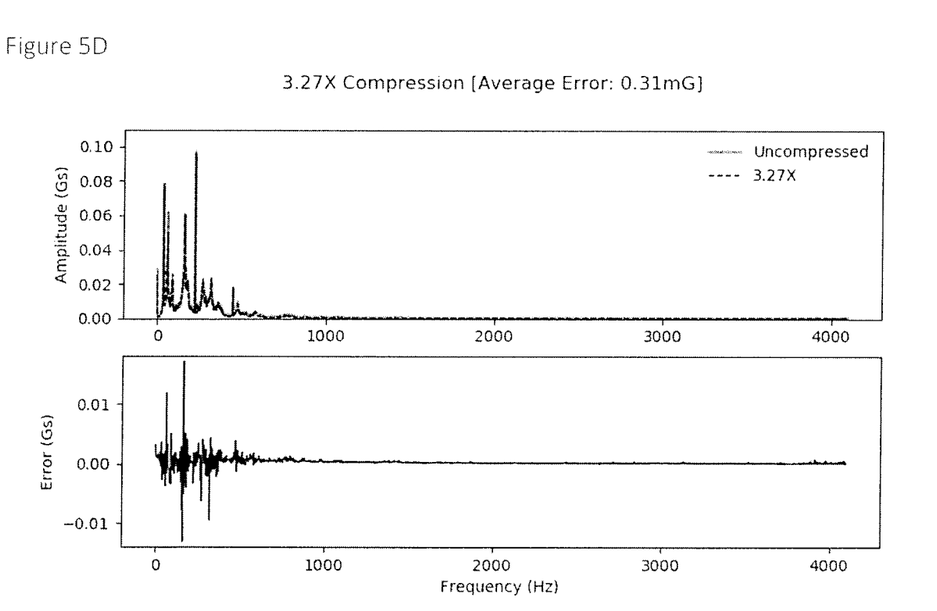
Figure 5E:
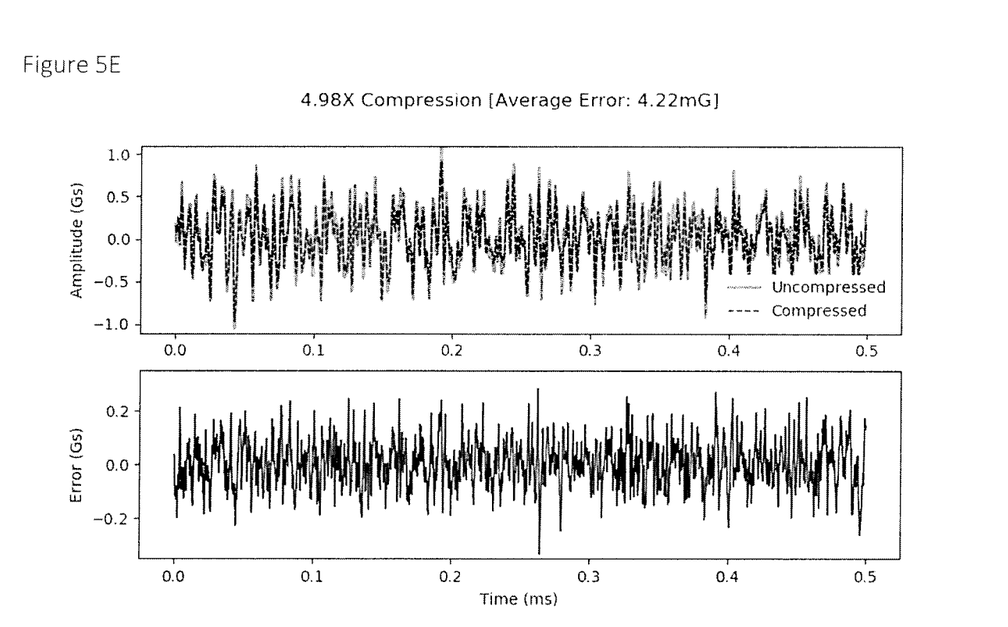
Figure 5F:
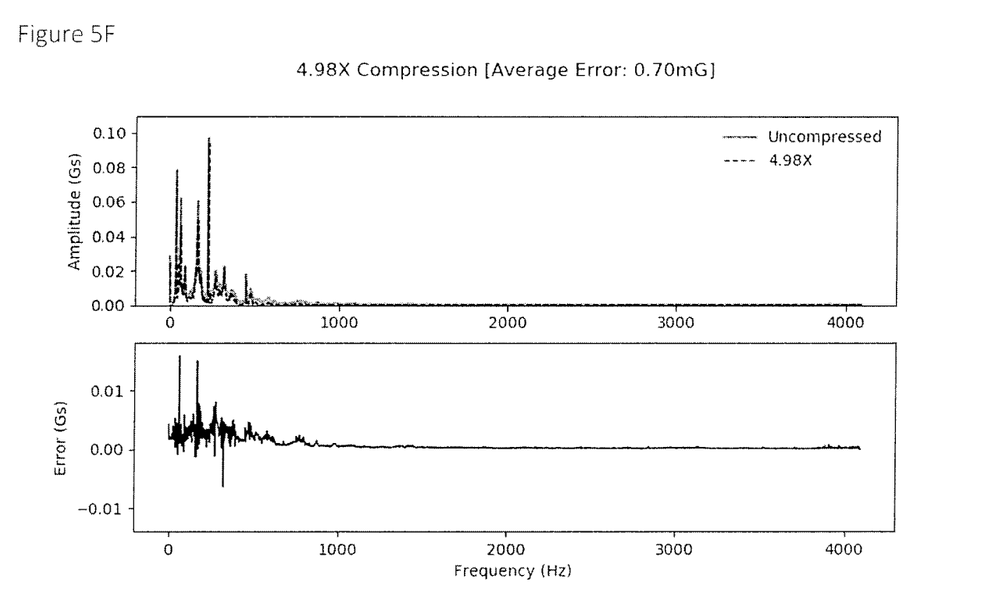

The frequency domain representation of the blower vibration and the corresponding error is shown in FIGS. 5B, 5D, 5F. Similarly, to the time waveform signals, the error in the compressed signal increases as the compression level is increased. Error in the signal can lead to a mis-diagnosis. However, error in the frequency spectrum and corresponding fault diagnosis often carries a lower importance than accurately capturing the severity of a fault and corresponding time series vibration magnitude.

Each figure shows the compressed data as a dashed line and uncompressed data as a solid line. The measurement signal is shown in the upper plot and the error or difference between the compressed and uncompressed signals are shown in the lower plots. FIG. 5A, 5C, 5E show the time series data for three different compression levels. FIG. 5B, 5D, 5F show the corresponding frequency domain data for the respective compression levels.

Figure 6:
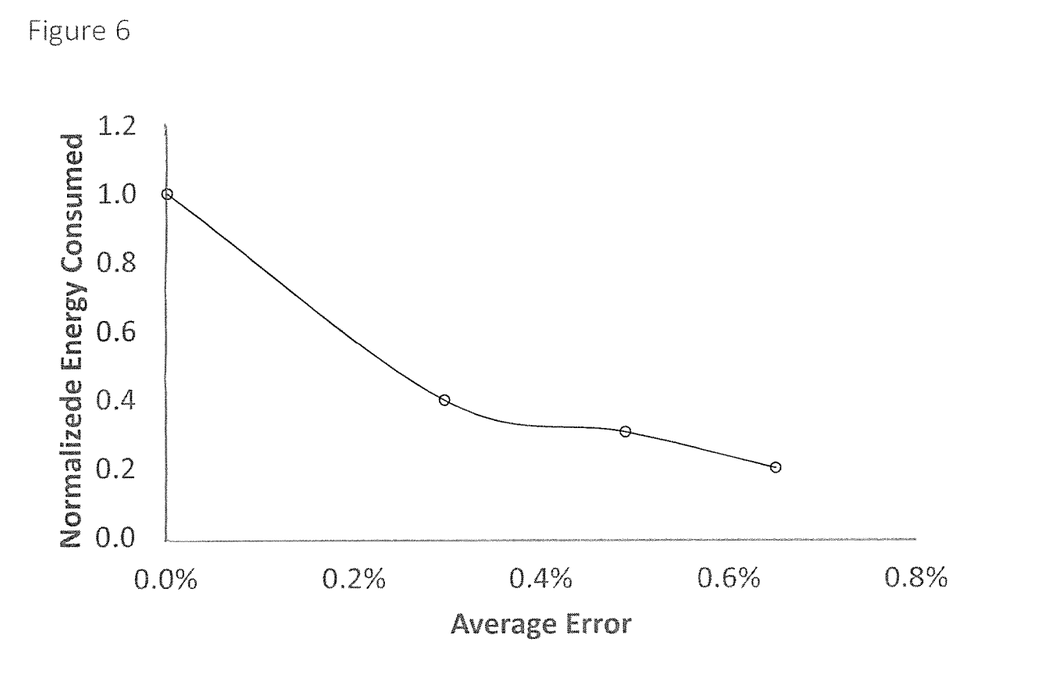
FIG. 6 illustrates the compression ratio versus compression induced error for an industrial fan blower machine.

FIG. 6 shows how the average error increases as the compression ratio increases and corresponding energy consumption of the node decreases. At the maximum compression level which equates to 5 times, the average error in the data is ~0.65% of the signal maximum amplitude. At a compression level of 2.5 times, the error is ~0.30%

The invention has several key advantages including a focus on minimizing the energy consumption of the end device. This requirement differentiates it from most compression methods, which are primarily focused on maximizing the compression ratio. The computational energy required to implement the invention is low because the mathematical operations are simple and can be implemented using fixed point math, thereby enabling use of ultra-low power and resource limited microprocessors. In contrast, compression techniques like Huffman encoding are computationally demanding and would not be practical to implement for most low power IIoT devices. This is because the computational energy consumption required to implement the compression would be larger than the energy saved by the wireless components based on sending less data. The invention's differencing and frequency domain transformations require a small amount of computational resources, which are far less than the energy saved by sending less data.

The CARL compression method is significant because it is uniquely designed to preserve key features in IIoT data while compromising the integrity of other features. In particular, it provides controllable and low compression error for certain key characteristics of the data that are important for determining machine health and selectively introduces loss to certain components that are not important within the context of IIoT applications. For example, most early bearing defects are apparent in frequency components that are a small fraction of the amplitude of the dominate frequency component associated with the fundamental machine rotation speed. Known compression methods like MP3 compression preserve only the large peaks in the frequency domain. This approach would typically set those bearing fault components to zero rendering the data sets useless. In contrast, this invention is designed to provide nearly lossless compression of those small amplitude components.

The CARL compression method is different from other compression techniques because it relies on discrete and sequential data transactions within the LAN. Unlike most applications like audio streaming, IIoT applications have the unique characteristic that data is sent on a regular basis and each group of data is similar. For this reason, the invention is not applicable for most audio or video streaming applications due the latency that it would introduce and the often time variant data streams.

However, this compression method is not applicable to certain applications where data is sent in-frequently or the data sampling varies between data groups. This is because a significant investment in energy and bandwidth usage must be made up-front to establish the baseline data. The baseline must be used many times before the energy investment in its establishment can be justified. In other words, the compression method according to the invention requires an initial investment to see a long-term benefit.

The data group (snapshot) consistency requirement is acceptable for IIoT applications because machine health data is organized into discrete blocks or snapshots of modest length, with consistency in the sampling of the snapshots in terms of their length, spacing between data points in the snapshot, and the number of points in the snapshot. The consistency in sampling aligns with the requirement of IIoT data analysis wherein frequency domain analysis is used. In particular, certain combinations of peaks in a machines spectrum are tied to faults such as misalignment, unbalance, gearbox, or bearing faults. Although consistency in the sampling is important the invention can accommodate changes in the sampling when the baseline is changed.

For example, within a typical snapshot, data points are sampled at a high frequency of 50 Hz to 10,000 Hz, with consistent time spacing of 20 to 0.1 millisecond, respectively. These snapshots may be taken on an intermittent but regular interval. The snapshots may also be triggered so that they align with the beginning of an operating cycle. The snapshot is typically 1 second and 90 seconds in duration and the snapshots are taken on an interval that may range between 1 and 60 minutes. For example, snapshots lasting 2 seconds may contain 4000 data points spaced every 0.5 milli-seconds (sampled at 2 kHz). These snapshots may be repeated every 5 minutes.

The invention works regardless of the size of the snapshot, packet structure, or structure of the LAN communication protocol. The invention is primarily designed to operate between nodes in a LAN and a data aggregation point. It may also apply to the backhaul of the data from the aggregation point to servers that store and analyze the data. This backhaul may be over a wireless or wired connection including cellular, satellite, or Ethernet on site. The LAN in which the nodes participate may include various topologies such as mesh, tree, and star networks. The invention applies to any of these network topologies. The communication protocol can be one directional from the nodes to the base station or it can be bidirectional. Although the LAN is typically and wireless infrastructure, it can also include a wired infrastructure using various protocols. The nodes in the LAN can be either battery powered, energy harvester powered, or in certain case us a hardwired power sources such as that provided by a controller or machine power bus.

In general, the IIoT devices or nodes that the invention applies provide an interface between aspects of the physical surroundings in which they are placed and the human or computer that is controlling or monitoring the physical surroundings. For example, sensor nodes may measure temperature, pressure, vibration, strain, position, or flow rate. In this example, the sensors are acquiring information from the physical surroundings, which could include a machine, process, or system, and delivering that information through a wireless communication network to the desired user or computer control interface. The sensor nodes may include the ability to receive data from the user or computer controller and deliver commands or control signals to the physical environment, which could include, for example a valve or switch. The sensor in this context includes not only features that are similar to a measurement node, but also additional features such as a bidirectional interface with its physical surroundings.

The baseline is stored on both the node and the location where the data sets are being reconstructed, typically at the base station. However, reconstruction and baseline establishment can also occur at a local server or a remote cloud server. The machine health data assessment, long-term storage of the data, and interface to external systems like the plan DCS or control systems can be done locally to the plant, as a part of a larger corporate network, or in a cloud hosted server. The sensor data may be combined with other data, analyzed in detail, and archived. The analysis may include diagnostic and prognostic calculations associated with the machine health. The analysis may also be designed to support industrial process optimization, such as determining when to open and close valves in order to avoid cavitation. A User Interface (UI) may display the raw sensor data or the results of the analysis, including machine health predictions. The UI can be locally hosted or remotely hosted. Depending on the network architecture, the data may be uncompressed at the base station or any other place downstream from the data's origin at the sensor. Some IIoT architectures envision the machine health being computed at the sensors or locally at the machine. For example frequency domain analysis could analyze a machine and identify a bearing fault. Rather than send the raw time series data that contains the fault, only the bearing fault status would need to be sent. The data packets would be orders of magnitude smaller. This model where intelligence is distributed to each individual asset works well for mature condition monitoring applications machine faults are well understood and sensor are integrated in the machine. This vision may take decades to come to fruition because the life cycle of industrial machines is on an order of 20-50 years. In practice most machine faults are complex, poorly understood, and may involve many pieces of equipment. In this reality, the intelligence must be centralized so that machine health methods can take advantage of lessons learned from other similar equipment, and from adjacent equipment data. This more near-term IIoT architecture consistent of large numbers of sensors sending unprocessed or mainly raw data to a central server for processing. The CARL compression method is designed to address the challenge created by sending large raw data sets to a central server. The intelligence may include supervised machine learning which is best implementing using large sets of historical data, thus further supporting the need for the centralized intelligence model.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A compression method for resource constrained local area networks comprising the steps of:
    establishing one or more sensor nodes within a wireless local area network, a sensor in each sensor node monitoring a physical condition and generating an electrical signal representing the physical condition, the wireless local area network including a base station, said base station receiving data from each sensor node and communicating with a server,
    acquiring by each sensor node baseline data sets,
    transmitting via the wireless local area network to the base station the acquired baseline data sets,
    storing the received baseline data sets as references by the base station,
    acquiring by each sensor node subsequent data sets at periodic time intervals,
    performing by each sensor node mathematical operations on the baseline and subsequent data sets to determine similarities between baseline and subsequent data sets,
    determining by each sensor node a difference between baseline and subsequent data sets to generate difference data sets,
    compressing the difference data sets by each sensor node using a combination of precision reduction and truncation,
    transmitting by each sensor node the compressed difference data sets via the wireless local area network to the base station, and
    reconstructing at the base station original data sets using the stored baseline data sets and the received compressed difference data sets.

2. The compression method of claim 1, wherein the sensor node includes a sensor transducer, which performs a measurement of a physical condition, and outputs a signal to an analog-to-digital converter (ADC) that produces a digital representation of the analog signal, further comprising the steps of:

performing a compression method evaluation on the digital output of the ADC to determine what compression technique best suites the node measurement data at a given point in time, as determined by the compression method evaluation, subjecting the digital output of the ADC to bit stream compression or to a Compression Agent for Resource-constrained Local-area-networks (CARL) which communicates with a baseline signal manager, and wirelessly transmitting a compressed representation of the output of the ADC.

3. The compression method of claim 2, wherein the step of compression evaluation is based on the type of data being sent, when data is dominated by noise and has a low amplitude, it is subjected to bit stream compression, but when data has a high amplitude, it is subjected to CARL compression.

4. The compression method of claim 2, wherein the CARL compression method comprises the steps of:

taking in a raw time-series signal, converting the raw signal to IQ15 fixed-point format and performing Fast Fourier Transform (FFT) on the raw signal, converting the FFT output from real/imaginary values to magnitude/phase values, checking to see if there is a valid baseline that has been constructed and if there is not already a valid baseline, using the magnitudes to aid in the construction of the baseline, otherwise, modifying the magnitudes by subtracting the baseline, amplifying the resulting magnitudes so that a minimum peak threshold is satisfied, the minimum peak threshold ensuring that a desired maximum error is not exceeded, and truncating the phases and amplified resulting magnitudes by removing fractional bits and ensuring integer representation of each value.

5. The compression method of claim 2, wherein the steps of performing a compression method evaluation and subjecting the digital output of the ADC to bit steam compression or CARL compression are implemented in the firmware of a microprocessor.

6. The compression method of claim 1, wherein the sensor nodes may measure temperature, pressure, vibration, strain, position, or flow rate.

7. The compression method of claim 1, wherein baseline data is stored on both the sensor node and a location where the data sets are reconstructed.

8. The compression method of claim 7, wherein data sets are reconstructed at the base station.

9. The compression method of claim 1, further comprising the steps of:

determining if a signal's frequency spectrum deviates from the baseline level so that the energy required to perform the CARL compression method consistently surpasses a desired threshold and, if so, nullifying the stored baseline and generating a new baseline that better represents the measured data.

10. The compression method of claim 9, wherein re-baselining comprises the steps of:

comparing a transmission energy $E_i$ of an input signal I with a calculated optimal transmission energy $E_{opt}$, considering an energy $E_{base}$ required to transmit a new baseline, the following conditions must hold to invoke the nullification of the active baseline:

$$NE_i > E_{base} + NE_{opt}$$

$$E_i > \frac{1}{N}E_{base} + E_{opt}$$

where N is the threshold defining the allowable disparity.

* * * * *